United States Patent
Kuo et al.

(10) Patent No.: US 9,137,909 B2
(45) Date of Patent: Sep. 15, 2015

(54) SPLICE TYPE DISPLAY BACK PLATE AND LIQUID CRYSTAL DISPLAY DEVICE

(75) Inventors: Yi-cheng Kuo, Guandong (CN);
Yu-chun Hsiao, Guandong (CN);
Chengwen Que, Guandong (CN);
Pangling Zhang, Guandong (CN);
Dehua Li, Guandong (CN)

(73) Assignee: Shenzhen China Star Optoelectronics Technology Co., Ltd, Shenzhen (CN)

( * ) Notice: Subject to any disclaimer, the term of this patent is extended or adjusted under 35 U.S.C. 154(b) by 484 days.

(21) Appl. No.: 13/575,933

(22) PCT Filed: Jul. 12, 2012

(86) PCT No.: PCT/CN2012/078572
§ 371 (c)(1),
(2), (4) Date: Jul. 27, 2012

(87) PCT Pub. No.: WO2014/008655
PCT Pub. Date: Jan. 16, 2014

(65) Prior Publication Data
US 2014/0016061 A1 Jan. 16, 2014

(30) Foreign Application Priority Data
Jul. 10, 2012 (CN) .......................... 2012 1 0238434

(51) Int. Cl.
*G02F 1/1333* (2006.01)
*H05K 5/02* (2006.01)

(52) U.S. Cl.
CPC ...... *H05K 5/02* (2013.01); *G02F 2001/133314* (2013.01)

(58) Field of Classification Search
CPC ..................... G02F 2001/133314; H05K 5/02
USPC ............. 349/58; 211/26; 361/679.21, 679.22, 361/679.26
See application file for complete search history.

(56) References Cited

U.S. PATENT DOCUMENTS

| 2007/0229731 A1* | 10/2007 | Lan et al. | 349/64 |
| 2013/0126451 A1* | 5/2013 | Kuo et al. | 211/26 |
| 2013/0128352 A1* | 5/2013 | Kuo et al. | 359/463 |

FOREIGN PATENT DOCUMENTS

| CN | 102402053 A | * | 4/2012 |
| CN | 102410508 A | * | 4/2012 |
| CN | 102506395 A | * | 6/2012 |

* cited by examiner

*Primary Examiner* — Dung Nguyen
*Assistant Examiner* — Tai Duong
(74) *Attorney, Agent, or Firm* — Andrew C. Cheng

(57) ABSTRACT

The present invention provides a splice type display back plate and a liquid crystal display device. The splice type display back plate includes at least two stents spliced together, each stent being disposed with enhancing ribs respectively, enhancing ribs including: at least two first enhancing parts disposed separately with interval at splicing locations of stents and second enhancing part connecting the at least two first enhancing parts; the first enhancing parts of two spliced stents overlapping and engaged chimerically. The display back plate of the present invention is formed by splicing two stents so as to reduce the weight of the back plate and material cost. Also, with enhancing ribs disposed on the two stents respectively, the enhancing ribs are located at splicing positions and connected in overlapping and chimerical manner to enhance the mechanical strength.

16 Claims, 2 Drawing Sheets

SPLICE TYPE DISPLAY BACK PLATE AND LIQUID CRYSTAL DISPLAY DEVICE

BACKGROUND OF THE INVENTION

1. Field of the Invention

The present invention relates to the field of liquid crystal displaying techniques, and in particular to a splice type display back plate and a liquid crystal display device.

2. The Related Arts

Liquid crystal display device is a popular product. With thin and light appearance, q liquid crystal display device in fact comprises many elements. For example, backlight module is a key element in the liquid crystal display device, and in turn, the back plate is the key element in backlight module. Back plate serves as the main support structure for the entire backlight module to protect optical elements inside the backlight module and provide the required mechanical strength for backlight module. As the size of liquid crystal display device increases, the current back plate also increases. The known back plate is usually of a monolithic structure, manufactured by stamping technique, which results in a back plate heavier in weight and higher in material cost.

SUMMARY OF THE INVENTION

The technical issue to be addressed by the present invention is to provide a splice type display back plate with low manufacturing cost and high mechanical strength and a liquid crystal display device.

The present invention provides a splice type display back plate, which comprises: at least two stents spliced together, each stent being disposed with enhancing ribs respectively, enhancing ribs comprising: at least two first enhancing parts disposed separately with interval at splicing locations of stents and second enhancing part connecting the at least two first enhancing parts; the first enhancing parts of two spliced stents overlapping and engaged chimerically; enhancing ribs of the at least two stents forming a closed-loop enhancing structure; first enhancing parts and second enhancing part forming bump on one side of stents and forming concave on the other side of stents, bump formed by first enhancing parts of one stent of the two spliced stents engaging concave formed by first enhancing parts of the other stent of the two spliced stents chimerically.

According to a preferred embodiment of the present invention, first enhancing parts of the two spliced stents are disposed fitly.

According to a preferred embodiment of the present invention, the at least two stents comprise two first main stents and two second main stents, the two first main stents are disposed in parallel, the two second main stents are disposed in parallel and ends of the second main stents are connected to ends of the first main stents to form at least a closed-loop rectangle frame.

According to a preferred embodiment of the present invention, the first enhancing parts disposed at the ends of the first main stent and the second main stent have a T shape.

According to a preferred embodiment of the present invention, the at least two stents further comprise at least an auxiliary stent, with two ends connected to area locations of the two first main stents or the two second main stents.

According to a preferred embodiment of the present invention, two ends of the auxiliary stent are connected to center areas of the two first main stents or the two second main stents in a cross (+) manner.

According to a preferred embodiment of the present invention, the enhancing parts are formed by stamping technique on the stents.

The present invention provides a splice type display back plate, which comprises: at least two stents spliced together, each stent being disposed with enhancing ribs respectively, enhancing ribs comprising: at least two first enhancing parts disposed separately with interval at splicing locations of stents and second enhancing part connecting the at least two first enhancing parts; the first enhancing parts of two spliced stents overlapping and engaged chimerically.

According to a preferred embodiment of the present invention, the enhancing ribs of the at least two stents form a closed-loop enhancing structure.

According to a preferred embodiment of the present invention, the first enhancing parts and second enhancing part forming bump on one side of stents and forming concave on the other side of stents, bump formed by first enhancing parts of one stent of the two spliced stents engaging concave formed by first enhancing parts of the other stent of the two spliced stents chimerically.

According to a preferred embodiment of the present invention, first enhancing parts of the two spliced stents are disposed fitly.

According to a preferred embodiment of the present invention, the at least two stents comprise two first main stents and two second main stents, the two first main stents are disposed in parallel, the two second main stents are disposed in parallel and ends of the second main stents are connected to ends of the first main stents to form at least a closed-loop rectangle frame.

According to a preferred embodiment of the present invention, the first enhancing parts disposed at the ends of the first main stent and the second main stent have a T shape.

According to a preferred embodiment of the present invention, the at least two stents further comprise at least an auxiliary stent, with two ends connected to area locations of the two first main stents or the two second main stents.

According to a preferred embodiment of the present invention, two ends of the auxiliary stent are connected to center areas of the two first main stents or the two second main stents in a cross (+) manner.

According to a preferred embodiment of the present invention, the enhancing parts are formed by stamping technique on the stents.

The present invention provides a liquid crystal display device, which comprises: an aforementioned splice type display back plate.

The efficacy of the present invention is that to be distinguished from the state of the art. In comparison with known technique, the display back plate of the present invention is formed by splicing two stents so as to reduce the weight of the back plate and material cost. Also, with enhancing ribs disposed on the two stents respectively, the enhancing ribs are located at splicing positions and connected in overlapping and chimerical manner to enhance the mechanical strength.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following description refers to the drawings and embodiments of the present invention.

Figure 1:
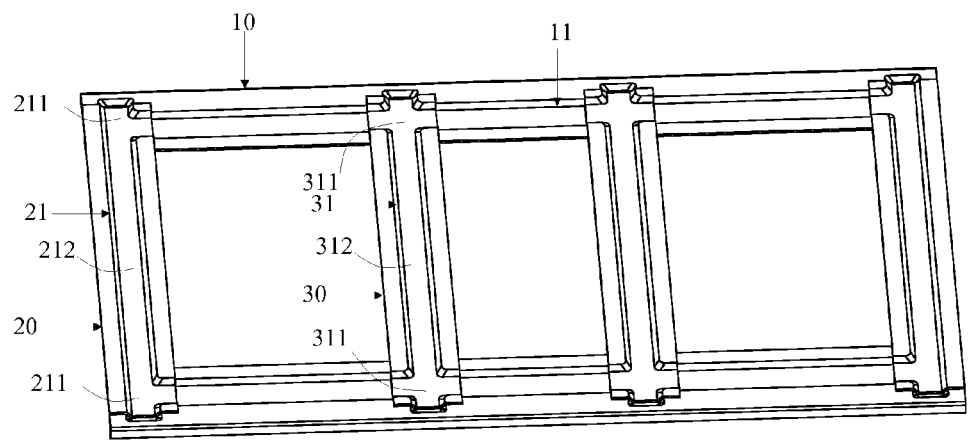
FIG. 1 is a schematic view showing the assembled splice type display back plate of the present invention.
Figure 2:
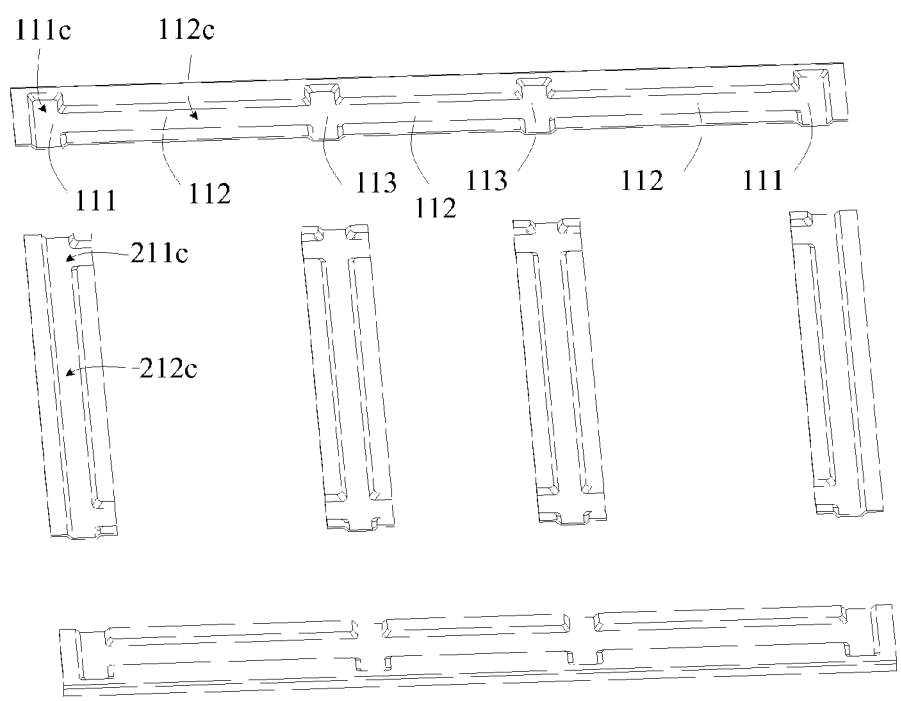
FIG. 2 is a schematic view showing the disassembled state of the splice type display back plate of FIG. 1.

Refer to FIG. 1 and FIG. 2. The present invention provides a splice type display back plate, which comprises two first main stents 10, two second main stents 20 and two auxiliary stents 30, spliced together.

In the instant embodiment, two first main stents 10 are disposed in parallel, and two second main stents are disposed in parallel. The ends of two second main stents are connected to the ends of two first main stents respectively to form a closed-loop rectangular frame. Two auxiliary stents 30 are disposed in parallel, with the ends of connecting to center areas of two first main stents 10 respectively to provide auxiliary support. In other embodiments, two auxiliary stents 30 are disposed in parallel, with the ends of connecting to center areas of two second main stents 20 respectively, and the number of auxiliary stents can be at least one or even zero, depending on the application. Furthermore, the number of stents for splice type display back plate can be varied according to the actual application. For example, the splice type display back plate can be formed by splicing two L-shaped stents together.

In the instant embodiment, first main stent 10, second main stent 20 and auxiliary stent 30 are disposed with enhancing ribs 11, 21, 31 respectively. Preferably, enhancing ribs 11, 21, 31 are formed by stamping technique on first main stent 10, second main stent 20 and auxiliary stent 30. Each of enhancing ribs 11, 21, 31 comprises at least two first enhancing parts disposed separately with interval at splicing locations of stents and second enhancing part connecting the at least two first enhancing parts. Specifically, enhancing rib 11 comprises two first enhancing part 111 on the ends of first main stent 10, two first enhancing parts 113 disposed at center area of first main stent 10 and second enhancing parts 112 for connecting first enhancing part 111 and first enhancing part 113 and connecting two first enhancing parts 113. Enhancing rib 21 comprises two first enhancing part 211 on the ends of second main stent 20 and second enhancing parts 212 for connecting two first enhancing part 211. Enhancing rib 31 comprises two first enhancing part 311 on the ends of auxiliary stent 30 and second enhancing parts 312 for connecting two first enhancing part 311. Furthermore, first enhancing parts 111, 211 disposed at the ends of first main stent 10 and second main stent 20 are preferably to have a T shape. First enhancing parts 311, 113 disposed at the ends of auxiliary stent 30 and center area of first main stent 10 and second main stent 20 are preferably to have a cross(+) shape.

In the instant embodiment, first enhancing parts 111, 113, 211, 311 of first main stent 10, second main stent 20, auxiliary stent 30 overlap and are engaged chimerically at the splicing positions on spliced stents.

Figure 3:
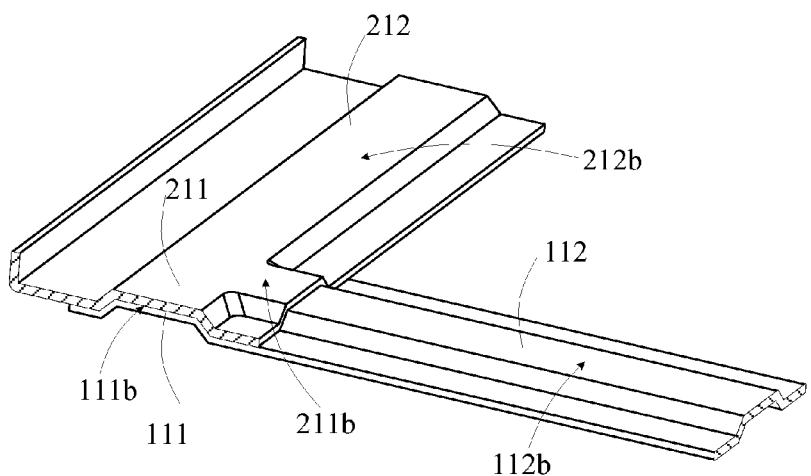
FIG. 3 is a partial schematic view of splicing positions on the splice type display back plate of FIG. 1.

Refer to FIG. 2 and FIG. 3 together. First enhancing parts 111 and second enhancing parts 112 on first main stent/bracket 10 form bumps 111b, 112b on one side of first main bracket 10 and correspondingly form concaves 111c, 112c (as denoted in FIG. 2) on the other side of first main bracket 10. First enhancing parts 211 and second enhancing parts 212 on second main bracket 20 form bumps 211b, 212b on one side of second main bracket 20 and correspondingly form concaves 211c, 212c (as denoted in FIG. 2) on the other side of second main bracket 20. At the splicing positions of first main bracket 10 and second main bracket 20, the bump 211b formed on one side of second main bracket 20 by first enhancing parts 211 of second main bracket 20 is engaged to the concave 111c formed on one side of first main stent 10 by first enhancing parts 111 of first main bracket 10, and preferably disposed in a fit manner. In addition, first enhancing parts 111, 113, 211, 311 can also be disposed similarly at other splicing positions, and the description will not be repeated here.

Figure 4:
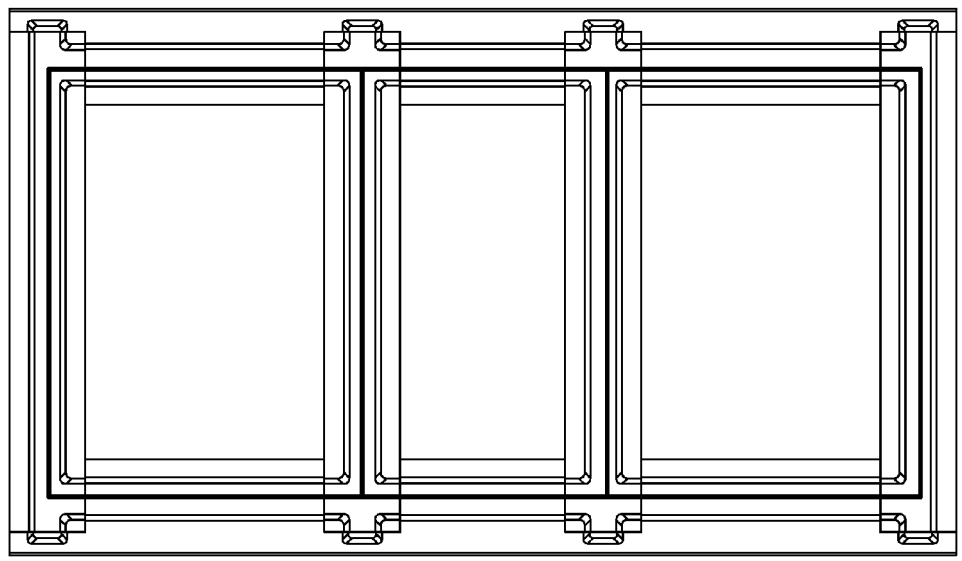
FIG. 4 is a schematic view of closed-loop enhancing structure on the splice type display back plate according to the present invention.

As such, second enhancing parts 112, 212, 312 of enhancing ribs 11, 21, 31 can be connected to first enhancing parts 111, 113, 211, 311 at splicing positions, and the spliced first enhancing parts 111, 113, 211, 311 are disposed in overlapping and chimerical manner to enhance strength propagation and improve mechanical strength of the back plate. Furthermore, enhancing ribs 11, 21, 31 are preferably connected to form a closed-loop enhancing structure. Refer to FIG. 4. In the instant embodiment, closed-loop enhancing structure is formed between two enhancing ribs 11 and two enhancing ribs 21, between two enhancing ribs 11, two enhancing ribs 21 and two enhancing ribs 31, and between two enhancing ribs 11 and two enhancing ribs 31 so as to further improve the mechanical strength of the back plate.

The present invention also provides a liquid crystal display device, which comprises an aforementioned splice type display back plate.

To distinguish from the known technique, the display back plate of the present invention is formed by splicing two stents so as to reduce the weight of the back plate and material cost. Also, with enhancing ribs disposed on the two stents respectively, the enhancing ribs are located at splicing positions and connected in overlapping and chimerical manner to enhance the mechanical strength.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A splice type display back plate, which comprises: at least two brackets spliced together, each bracket being disposed with a continuous enhancing rib, the enhancing rib comprising: at least two first enhancing parts disposed separately with interval at splicing locations of brackets and second enhancing part connecting the at least two first enhancing parts to thereby form the continuous enhancing rib; the first enhancing parts of two spliced brackets overlapping and engaged with each other; enhancing ribs of the at least two brackets forming a closed-loop enhancing structure; first enhancing parts and second enhancing part forming bump on one side of brackets and forming concave on the other side of brackets, bump formed by first enhancing parts of one bracket of the two spliced brackets engaging with concave formed by first enhancing parts of the other bracket of the two spliced brackets.

2. The splice type display back plate as claimed in claim 1, characterized in that the first enhancing parts of the two spliced brackets are disposed fitly.

3. The splice type display back plate as claimed in claim 1, characterized in that the at least two brackets comprise two first main brackets and two second main brackets, the two first main brackets are disposed in parallel, the two second main brackets are disposed in parallel and ends of the second main brackets are connected to ends of the first main brackets to form at least a closed-loop rectangular frame.

4. The splice type display back plate as claimed in claim 3, characterized in that the first enhancing parts disposed at the ends of the first main bracket and the second main bracket have a T shape.

5. The splice type display back plate as claimed in claim 3, characterized in that the at least two brackets further comprise at least an auxiliary bracket, with two ends connected to center areas of the two first main brackets or the two second main brackets.

6. The splice type display back plate as claimed in claim 5, characterized in that two ends of the auxiliary bracket are connected to center areas of the two first main brackets or the two second main brackets in a cross (+) manner.

7. The splice type display back plate as claimed in claim 1, characterized in that the enhancing parts are formed by stamping technique on the brackets.

8. A splice type display back plate, which comprises: at least two brackets spliced together, each bracket being disposed with a continuous enhancing rib, the enhancing rib comprising: at least two first enhancing parts disposed separately with interval at splicing locations of brackets and second enhancing part connecting the at least two first enhancing parts to thereby form the continuous enhancing rib; the first enhancing parts of two spliced brackets overlapping and engaged with each other; the enhancing ribs of the at least two brackets forming a closed-loop enhancing structure.

9. The splice type display back plate as claimed in claim 8, characterized in that the first enhancing parts and second enhancing part forming bump on one side of brackets and forming concave on the other side of brackets, bump formed by first enhancing parts of one bracket of the two spliced brackets engaging with concave formed by first enhancing parts of the other bracket of the two spliced brackets.

10. The splice type display back plate as claimed in claim 9, characterized in that the first enhancing parts of the two spliced brackets are disposed fitly.

11. The splice type display back plate as claimed in claim 9, characterized in that the at least two brackets comprise two first main brackets and two second main brackets, the two first main brackets are disposed in parallel, the two second main brackets are disposed in parallel and ends of the second main brackets are connected to ends of the first main brackets o form at least a closed-loop rectangular frame.

12. The splice type display back plate as claimed in claim 11, characterized in that the first enhancing parts disposed at the ends of the first main bracket and the second main bracket have a T shape.

13. The splice type display back plate as claimed in claim 11, characterized in that the at least two brackets further comprise at least an auxiliary bracket, with two ends connected to center areas of the two first main brackets or the two second main brackets.

14. The splice type display back plate as claimed in claim 13, characterized in that two ends of the auxiliary bracket are connected to center areas of the two first main brackets or the two second main brackets in a cross (+) manner.

15. The splice type display back plate as claimed in claim 8, characterized in that the enhancing parts are formed by stamping technique on the brackets.

16. A liquid crystal display device, characterized in that the liquid crystal display device comprises a splice type display back plate as claimed in claims 1-8 or 9-15.

* * * * *